United States Patent [19]

Carney et al.

[11] Patent Number: 4,601,061
[45] Date of Patent: Jul. 15, 1986

[54] AUTOMATIC FREQUENCY CONTROL CIRCUIT HAVING AN EQUALIZED CLOSED LOOP FREQUENCY RESPONSE

[75] Inventors: Scott N. Carney, Hoffman Estates; Donald L. Linder, Palatine, both of Ill.

[73] Assignee: Motorola Inc., Schaumburg, Ill.

[21] Appl. No.: 627,159

[22] Filed: Jul. 2, 1984

[51] Int. Cl.$^4$ ............................................. H04B 1/26
[52] U.S. Cl. .................... 455/208; 455/214; 455/263; 329/122; 333/172; 331/32
[58] Field of Search ............... 455/208, 214, 261, 263; 329/122; 333/172; 331/15, 32

[56] References Cited

U.S. PATENT DOCUMENTS

| | | | |
|---|---|---|---|
| 3,238,460 | 3/1966 | Enloe | 455/208 |
| 3,286,188 | 11/1966 | Castellano, Jr. | 329/122 |
| 3,764,917 | 10/1973 | Rhee | |
| 3,784,917 | 1/1974 | Kenyon | |
| 3,852,686 | 12/1974 | Morii | 331/177 |
| 4,087,756 | 5/1978 | Rogers, Jr. | 455/263 |
| 4,466,128 | 8/1984 | Couvillon | 455/263 |

OTHER PUBLICATIONS

Mischa Schwartz, William R. Bennett, & Seymour Stein, "Communication Systems and Techniques", *Inter-University Electronics Series*, vol. 4, (1966) 154-160.
A. Bruce Carlson, "Communication Systems", (1975) 284-287.
Scott Carney and Don Linder, "A Digital Mobile Radio for 5-6 Kilohertz Channels", *IEEE International Conference on Communications*, vol. 3, (1982).

*Primary Examiner*—Jin F. Ng
*Attorney, Agent, or Firm*—Charles L. Warren; Edward M. Roney; Donald B. Southard

[57] ABSTRACT

An AFC circuit may include an oscillator having an output frequency responsive to a derived error signal, a mixer for mixing a received signal with the output of the oscillator to produce an intermediate frequency, and a signal recovery detector for recovering the information carried by the intermediate frequency. An integral loop filter and compensation circuit receives the recovered signal from the detector, provides a compensated recovery signal which is independent of the closed loop frequency response of the AFC circuit, and provides an error signal which controls the oscillator.

6 Claims, 6 Drawing Figures

AUTOMATIC FREQUENCY CONTROL CIRCUIT HAVING AN EQUALIZED CLOSED LOOP FREQUENCY RESPONSE

BACKGROUND OF THE INVENTION

This invention generally relates to automatic frequency control (AFC) loops which are utilized to automatically track or adjust the frequency of a received signal. This invention more specifically addresses the AFC loop filter and the effect of the closed loop frequency response of the AFC loop on the information recovered from a received signal by using an AFC circuit.

Various types of AFC circuits are well known. A feedback network responsive to a detected frequency error of a desired signal is utilized by an AFC circuit to change the frequency of a generated signal to minimize the detected frequency error.

This invention is particularly, but not exclusively, suited for use in a wireless communications receiver with an AFC circuit which minimizes the frequency error of a received FM signal. In such an application, a low pass filter has been utilized in the feedback loop of an AFC circuit to filter the recovered audio signal to provide an error signal. For example, see U.S. Pat. No. 3,764,917 issued to Dong Woo Rhee, and an article entitled "A Digital Mobile Radio for 5-6 Kilohertz Channels" by Scott Carney and Don Linder published June, 1982, in Vol. 3 of the *IEEE International Conference on Communications*.

A disadvantage in utilizing a conventional one pole low pass filter in an AFC loop is that the AFC closed loop frequency response causes attenuation of low frequencies in the recovered information. This results in degradation in the recovery of digital signals.

SUMMARY OF THE INVENTION

It is an object of this invention to provide an AFC circuit having an improved closed loop frequency response.

Another object of this invention is to provide a filter having an integrally associated compensation network for an AFC circuit to minimize the effect of the AFC circuit on the recovered information.

An embodiment of an AFC circuit in accordance with the present invention includes an oscillator having an output frequency responsive to a derived error signal, a mixer for mixing a received signal with the output of the oscillator to produce an intermediate frequency, and a signal recovery detector for recovering the information carried by the intermediate frequency. An integral loop filter and compensation circuit receives the recovered signal from the detector, provides a compensated recovered signal which is independent of the closed loop frequency response of the AFC circuit, and provides an error signal which controls the oscillator.

The filter and compensation circuit preferably consists of a series circuit consisting of a first resistor, a second resistor, and a capacitor. The junction between the resistors provides the compensated output signal and the junction between the second resistor and the capacitor provides the error control signal. The compensated output signal will be independent of the frequency response of the AFC circuit if the ratio of the first resistor to the second resistor is equal to the product of the transfer constants associated with the oscillator and the detector.

DETAILED DESCRIPTION

An important aspect of the present invention is the discovery of the source of a problem causing a frequency response limitation of the recovered signal due to the closed loop frequency response of an AFC circuit having a low pass filter. Therefore, an explanation of the discovery and analysis of the problem which led to the present invention follows.

Figure 1:
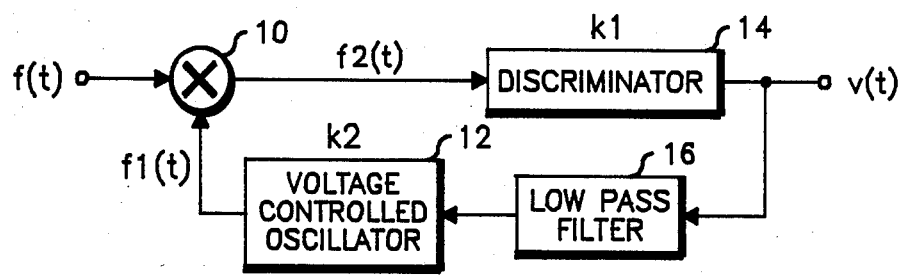
FIG. 1 is a block diagram illustrating an AFC circuit.

In FIG. 1, a mixer 10 receives a frequency modulated input signal which in the illustrated embodiment has an instantaneous frequency f(t). The mixer receives as its other input an injection signal consisting of the output of a voltage controlled oscillator (VCO) 12 which has as its instantaneous frequency f1(t). The output of mixer 10 has instantaneous frequency f2(t) and represents an intermediate frequency corresponding to the input signal shifted in frequency. The output of mixer 10 is applied to a signal detector such as a discriminator 14 which recovers the message or information carried by the instantaneous frequency f2(t). Since the message is carried by frequency modulation in this example, detector 14 may consist of a discriminator which converts the frequency variations into voltage variations represented by v(t). A filter 16 filters the recovered signal v(t) and provides an output AFC control error signal to VCO 12. The output of discriminator 14 i.e. v(t), represents the recovered message signal and may be processed in a conventional manner by circuits not shown. It will be apparent to those skilled in the art that v(t) may be an amplitude varying voltage representative of voice communications or may carry digitized information.

Conversion constants K1 and K2 are associated with discriminator 14 and VCO 12, respectively as follows:

$$v(t) = K1\, f2(t) \quad (1)$$

$$f1(t) = v(t) * g(t)\, K2 \quad *\text{convolution} \quad (2)$$

In the above equations, K1 represents a constant associated with the conversion of the frequency modulated signal f2(t) into a voltage varying signal. Similarly, K2 represents a constant of conversion from converting the error signal of filter 16 into a frequency varying signal. The transfer characteristic of filter 16 is represented by g(t).

The following equation 3 expresses f2(t) as a function of the input frequency and the injection frequency assuming the difference frequency from mixer 10 is selected.

$$f2(t) = f(t) - f1(t) \quad (3)$$

Equation 4 represents the Laplace transform V(s) of the recovered voltage v(t).

$$V(s) = K1[F(s) - F1(s)] \quad (4)$$

In equation 5, the Laplace transformation of the injection signal f1(t) is shown.

$$F1(s) = K2\ G(s)\ V(s) \quad (5)$$

The solution for F1(s) as shown in equation 5 is substituted into equation 4 to yield equation 6.

$$V(s) = K1\ F(s) - K1\ K2\ G(s)\ V(s) \quad (6)$$

Solving equation 6 for V(s) divided by F(s) results in the below equation 7.

$$\frac{V(s)}{F(s)} = \frac{K1}{1 + K1\ K2\ G(s)} \quad (7)$$

Upon observing equation 7 it will be apparent that the recovered signal v(t) having a Laplace transformation V(s) is dependent upon the frequency response of the filter 16, i.e. G(s) appears in the denominator. Thus, if the response of filter 16 varies with frequency, the recovered signal will undesirably also be affected.

Figure 2:
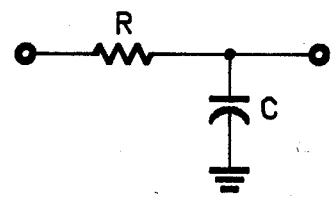
FIG. 2 illustrates a conventional one pole low pass filter.

A one pole low pass filter such as shown in FIG. 2 can be used as filter 16. This filter has only a series resistor R and a shunt capacitor C. The frequency response of such a filter is shown in equation 8.

$$G(s) = \frac{1}{1 + sT} \text{ where } T = R \cdot C \quad (8)$$

Substituting this frequency response into equation 7 and rearranging terms results in equation 9.

$$\frac{V(s)}{F(s)} = \frac{K1}{1 + K1\ K2} \frac{1 + sT}{1 + \frac{sT}{1 + K1\ K2}} \quad (9)$$

Figure 3:
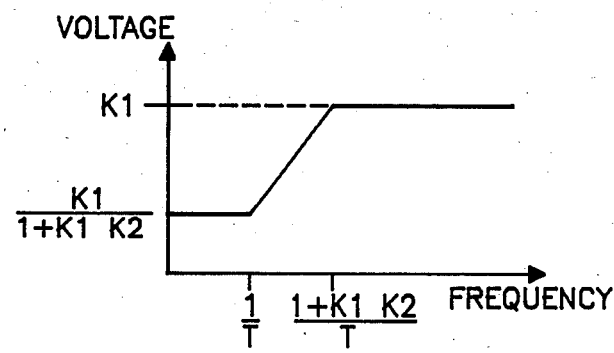
FIG. 3 is a graph illustrating the closed loop frequency response of the AFC circuit of FIG. 1 using the filter shown in FIG. 2.

FIG. 3 is a Bode diagram illustrating the response as defined by equation 9 with respect to frequency. It will be apparent that "corner" frequencies of 1/T and (1+K1 K2)/T are present and effect the lower frequency response of this circuit. This diagram visually illustrates that the lower frequency components of the recovered signal v(t) will be attenuated due to the AFC circuit.

Figure 4:
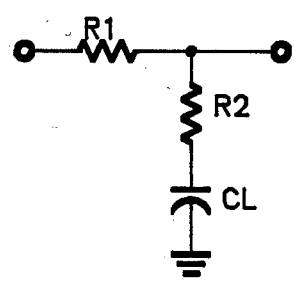
FIG. 4 illustrates a lag circuit.

FIG. 4 illustrates a lag network which consists of a series resistor R1 and shunt elements resistor R2 and capacitor C1. The purpose of this network is to compensate the recovered signal v(t) so that its frequency response will be the same as if the AFC circuit was not used.

Figure 5:
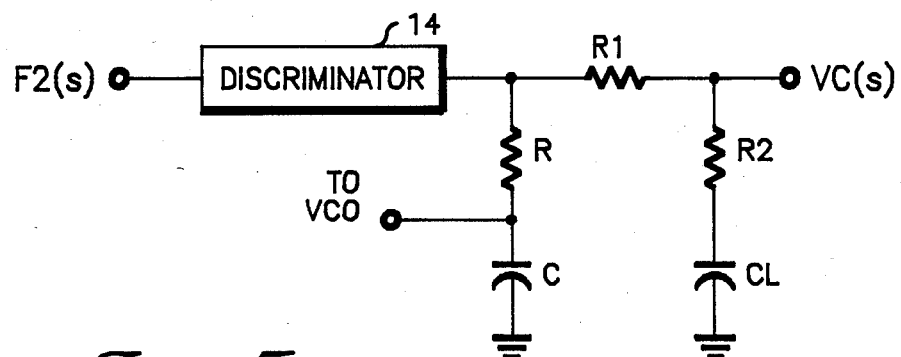
FIG. 5 illustrates the lag circuit shown in FIG. 4 utilized with an AFC circuit having the low pass circuit shown in FIG. 2.

FIG. 5 illustrates the lag network coupled to the AFC circuit of FIG. 1 to equalize the frequency response of the recovered signal by providing a compensated signal vc(t) having a Laplace transformation of VC(s). It will be apparent that the lag network receives the signal v(t) from discriminator 14. The frequency response of the lag network is given by equation 10.

$$F\text{-lag}\ (s) = \frac{1 + sT2}{1 + sT1} \text{ where } T1 > T2 \quad (10)$$

The time constants T1 and T2 which determine the zero and the pole, respectively, are expressed in equation 11.

$$T1 = C1(R1 + R2) \text{ and } T2 = C1.R2 \quad (11)$$

The frequency response of the compensated output signal VC(s) is represented in equation 12.

$$\frac{VC(s)}{F(s)} = \frac{K1}{1 + K1\ K2} \frac{1 + sT}{1 + \frac{sT}{1 + K1\ K2}} \frac{1 + sT2}{1 + sT1} \quad (12)$$

In order to eliminate the variations in the recovered information as a function of frequency, the pole (T1) of the lag network must cancel the zero (T) associated with the closed loop response of the AFC circuit and the zero (T2) of the lag network must cancel the pole corresponding to T/(1+K1 K2); that is, the following equations must be satisfied:

$$T = T1 \quad (13A)$$

$$T2 = \frac{T}{1 + K1\ K2} \quad (13B)$$

$$R \cdot C = C1(R1 + R2) \quad (14A)$$

$$C1 \cdot R2 = \frac{R \cdot C}{1 + K1\ K2} \quad (14B)$$

The above equations 14 are derived from the corresponding equations 13 by substituting for the terms T, T1, and T2 previously defined in equations 8 and 11. The following equation 15 is derived by substituting into equation 14B the equivalent R.C defined by equation 14A.

$$K1\ K2 = \frac{R1}{R2} \quad (15)$$

As long as the values of the resistors and capacitors are selected such that equations 14A and 15 are satisfied, the lag network will have compensated the closed loop response of the AFC circuit shown in FIG. 1 so that equation 12 simplifies to that shown in equation 16.

$$\frac{VC(s)}{F(s)} = \frac{K1}{1 + K1\ K2} \quad (16)$$

Upon observing equation 16 for the complete response of the AFC circuit of FIG. 5, it will be apparent that the compensated signal VC(s) is not a function of frequency, i.e. (s).

Further considering the requirements of equations 14A, 14B, and 15, choose C=C1. Based on this condition, it will be apparent from equation 14A that R=R1+R2. If resistor R equals resistor R1 plus R2, and capacitor C equals capacitor C1, the same voltage will appear across capacitor C and C1 since the lag network will represent another electrically equivalent circuit in parallel with the low pass filter circuit RC. Assuming that negligible current will be consumed by the circuitry to be connected to the junction of resistors R1 and R2, i.e. VC(s), the same AFC error signal to VCO 12 could be provided by connecting the VCO to the junction of resistor R2 and capacitor C1. Therefore, the low pass filter consisting of resistor R and capacitor C can be omitted by the selection of a lag network having the parameters as stated above.

Figure 6:
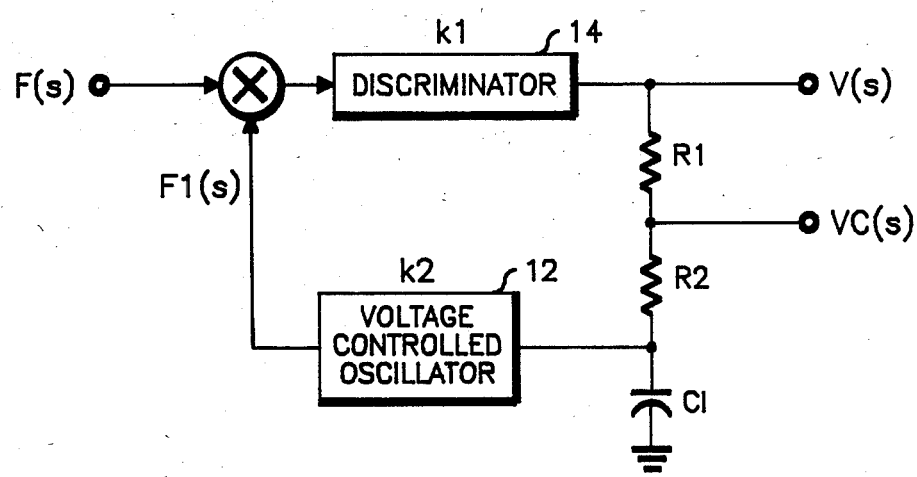
FIG. 6 illustrates a preferred embodiment of the present invention consisting of an integral filter and compensation circuit for an AFC circuit.

FIG. 6 illustrates an AFC circuit equivalent to that shown in FIG. 5 if the following assumptions are met: C=C1, R=R1+R2, K1 K2=R1/R2 and very small current is drawn by any circuit connected to VC(s). This illustrated circuit yields an output compensated signal VC(s) which is not a function of the frequency response of the closed loop AFC circuit as shown in equation 16. Utilizing the combined filter and lag network shown in FIG. 6, i.e. resistors R1, R2, and capacitor C1, the closed loop compensated output voltage VC(s) will be independent of frequency if K1 K2=R1/R2. As long as this condition is met, the combined compensation and filter circuit of FIG. 6 will provide perfect pole and zero cancellation; that is, referring to equation 12, T=T1 and T2=T/(1+K1 K2). Both from mathematical and physical viewpoints, complete cancellation is achieved.

Referring to FIG. 6, the low pass filter characteristic selected by the designer is defined by (R1+R2) C1. After this selection is made, the values of R1, R2 and C1 will be specified since R1/R2 must equal K1 K2. The combined low pass filter and compensation network allows the AFC loop to have the desired low pass filter characteristic without causing the output compensated voltage signal VC(s) to be a function of the closed loop frequency response.

Although an embodiment of the present invention is described and shown in the drawings, the scope of this invention is defined by the claims appended hereto.

What is claimed is:

1. In a circuit having a detector for recovering information carried by a signal of a predetermined frequency applied to the detector and an automatic frequency control (AFC) circuit including means for varying the frequency of the signal applied to the detector in response to an error signal, and means responsive to the recovered information for generating the error signal which causes said varying means to adjust the frequency of the signal applied to the detector to be said predetermined frequency, the detector, generating means, and varying means defining a closed loop circuit having a closed loop frequency response, the improvement comprising:

said generating means including a single means for low pass filtering said information to produce the error signal and for simultaneously compensating the frequency response of the recovered information so that it is independent of said closed loop frequency response, said single means having one output carrying said error signal and another output carrying said compensated recovered information.

2. The invention of claim 1 wherein said single means comprises a resistor R1 having one end connected to said detector, a resistor R2 having one end connected to the other end of resistor R1, and a capacitor C having one end connected to the other end of resistor R2 and the other end coupled to a reference voltage, said compensated information present at the junction of resistors R1 and R2, said error signal present at the junction of resistor R2 and capacitor C.

3. The invention of claim 2 wherein said detector has a conversion constant K1 according to $v(t)=K1\ f2(t)$ where $f2(t)$ is the instantaneous frequency of a modulated signal and $v(t)$ is the recovered information, and said frequency varying means includes a voltage controlled oscillator (VCO) having a conversion constant K2 according to $f1(t)=K2\ g(t)*v(t)$ where $g(t)$ is a transfer function of said low pass filtering means and $f1(t)$ is the instantaneous frequency of the output of said VCO, said resistors R1 and R2 and said constants K1 and K2 satisfying the equation R1/R2=K1 K2 whereby said compensated information is independent of the closed loop frequency response of the AFC circuit.

4. The invention of claim 3 wherein said frequency varying means further comprises a mixer that mixes the VCO output with an input signal having an instantaneous frequency of $f(t)$ to produce said signal $f2(t)$.

5. The invention of claim 1 wherein said signal is frequency modulated to carry said information.

6. The invention of claim 5 wherein said detector is a discriminator which converts said frequency modulated information into an amplitude varying signal.

* * * * *